US012581902B2

(12) United States Patent
Moriya et al.

(10) Patent No.: US 12,581,902 B2
(45) Date of Patent: Mar. 17, 2026

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Atsushi Moriya, Toyama (JP); Yukinori Aburatani, Toyama (JP); Satoshi Takano, Toyama (JP); Naofumi Ohashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 682 days.

(21) Appl. No.: 17/940,135

(22) Filed: Sep. 8, 2022

(65) Prior Publication Data

US 2023/0282505 A1 Sep. 7, 2023

(30) Foreign Application Priority Data

Mar. 7, 2022 (JP) .............................. JP2022-034844

(51) Int. Cl.
*H01L 21/677* (2006.01)
*F27B 17/00* (2006.01)
(Continued)

(52) U.S. Cl.
CPC .... *H01L 21/67742* (2013.01); *F27B 17/0025* (2013.01); *H01L 21/67196* (2013.01); *H01L 21/67201* (2013.01); *H01L 21/68764* (2013.01)

(58) Field of Classification Search
CPC ......... H01L 21/67742; H01L 21/67196; H01L 21/67201; H01L 21/68764;
(Continued)

(56) References Cited

U.S. PATENT DOCUMENTS 11,842,908 B2 * 12/2023 Rajavelu Muralidhar ..................
H01K 7/00
2007/0184636 A1 8/2007 Takano
(Continued)

FOREIGN PATENT DOCUMENTS

WO      2005/112108 A1    11/2005
WO      WO-2020086122 A1 *  4/2020   .............. B23Q 3/15
WO      WO-2022258800 A1 * 12/2022   ........... A61B 5/0059

OTHER PUBLICATIONS

Taiwanese Office Action issued Jun. 5, 2023 for Taiwan Office Action No. 111125362.

*Primary Examiner* — Mohammed Shamsuzzaman
(74) *Attorney, Agent, or Firm* — Volpe Koenig

(57) ABSTRACT

There is provided a technique for suppressing interference between processes respectively performed in the plurality of reactors. According to one aspect thereof, a substrate processing apparatus includes: a first vessel including a transfer port and a process chamber; a second vessel adjacent to the first vessel and communicating with the first vessel via the transfer port; a lid for closing the transfer port; a seal arranged between the transfer port and the lid; and a controller for controlling the inner pressure of the first vessel to be lower than the inner pressure of the second vessel with the transfer port closed by the lid while the substrate is processed in the process chamber and the inner pressure of the first vessel to be higher than the inner pressure of the second vessel after the substrate is processed and before the first vessel comes into communication with the second vessel.

20 Claims, 9 Drawing Sheets

(51) Int. Cl.
     *H01L 21/67*          (2006.01)
     *H01L 21/687*         (2006.01)

(58) Field of Classification Search
     CPC ......... H01L 21/67017; H01L 21/67109; H01L
                           21/67126; H01L 21/67167; H01L
                           21/6719; H01L 21/67757; H01L
                           21/67155; H01L 21/67098; H01L
                           21/67207; F27B 17/0025; C23C
                  16/45557; C23C 16/4583; C23C 16/46;
                                        C23C 16/56
     See application file for complete search history.

(56)                    References Cited

U.S. PATENT DOCUMENTS

2015/0076135 A1 *    3/2015  Merry ............... H01L 21/67103
                                                         219/448.11
2018/0148834 A1 *    5/2018  Kamimura ........ H01L 21/67775
2019/0019705 A1 *    1/2019  Nakada ............. C23C 16/45578

* cited by examiner

START

S302 — PRESSURE ADJUSTING STEP

S304 — SUBSTRATE SUPPORT STRUCTURE LOWERING STEP

END

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2022-034844, filed on Mar. 7, 2022, in the Japanese Patent Office, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Related Art

According to some related arts, as an example of a substrate processing apparatus used in a manufacturing process of a semiconductor device, a cluster type apparatus provided around a plurality of reactors and a vacuum transfer chamber may be used. The plurality of reactors may be configured to be capable of performing different processes, respectively. For example, a film-forming process may be performed in a first reactor among the plurality of reactors, and a modification process may be performed in a second reactor among the plurality of reactors. A substrate processed in a reactor such as the first reactor may be transferred to another reactor such as the second reactor via the vacuum transfer chamber, or may be transferred out of the substrate processing apparatus.

As described above, since the plurality of reactors are configured to be capable of performing the different processes, respectively, it is preferable to suppress interference between processes respectively performed in the plurality of reactors.

SUMMARY

According to the present disclosure, there is provided a technique capable of suppressing interference between processes respectively performed in a plurality of reactors when the plurality of reactors are configured to be capable of performing different processes, respectively.

According to one aspect of the technique of the present disclosure, there is provided a substrate processing apparatus including: a first vessel including: a loading/unloading port structure constituting a loading/unloading port through which a substrate is capable of being transferred; and a process chamber in which the substrate is accommodated; a second vessel provided adjacent to the first vessel and configured to be capable of communicating with the first vessel via the loading/unloading port; a lid configured to be capable of closing the loading/unloading port; a seal arranged between the loading/unloading port structure and the lid; and a controller configured to be capable of controlling an inner pressure of the first vessel and an inner pressure of the second vessel such that the inner pressure of the first vessel is set to be lower than the inner pressure of the second vessel with the loading/unloading port closed by the lid while the substrate is processed in the process chamber and such that the inner pressure of the first vessel is set to be higher than the inner pressure of the second vessel after the substrate is processed and before the first vessel comes into communication with the second vessel.

BRIEF DESCRIPTION OF THE DRAWINGS

FIG. 7 is a block diagram schematically illustrating a configuration of a controller and related components of the substrate processing apparatus according to the embodiments of the present disclosure.

FIG. 9 is a flow chart schematically illustrating a pressure adjusting step and a substrate support structure lowering step according to the embodiments of the present disclosure.

DETAILED DESCRIPTION

Embodiments

Figure 1:
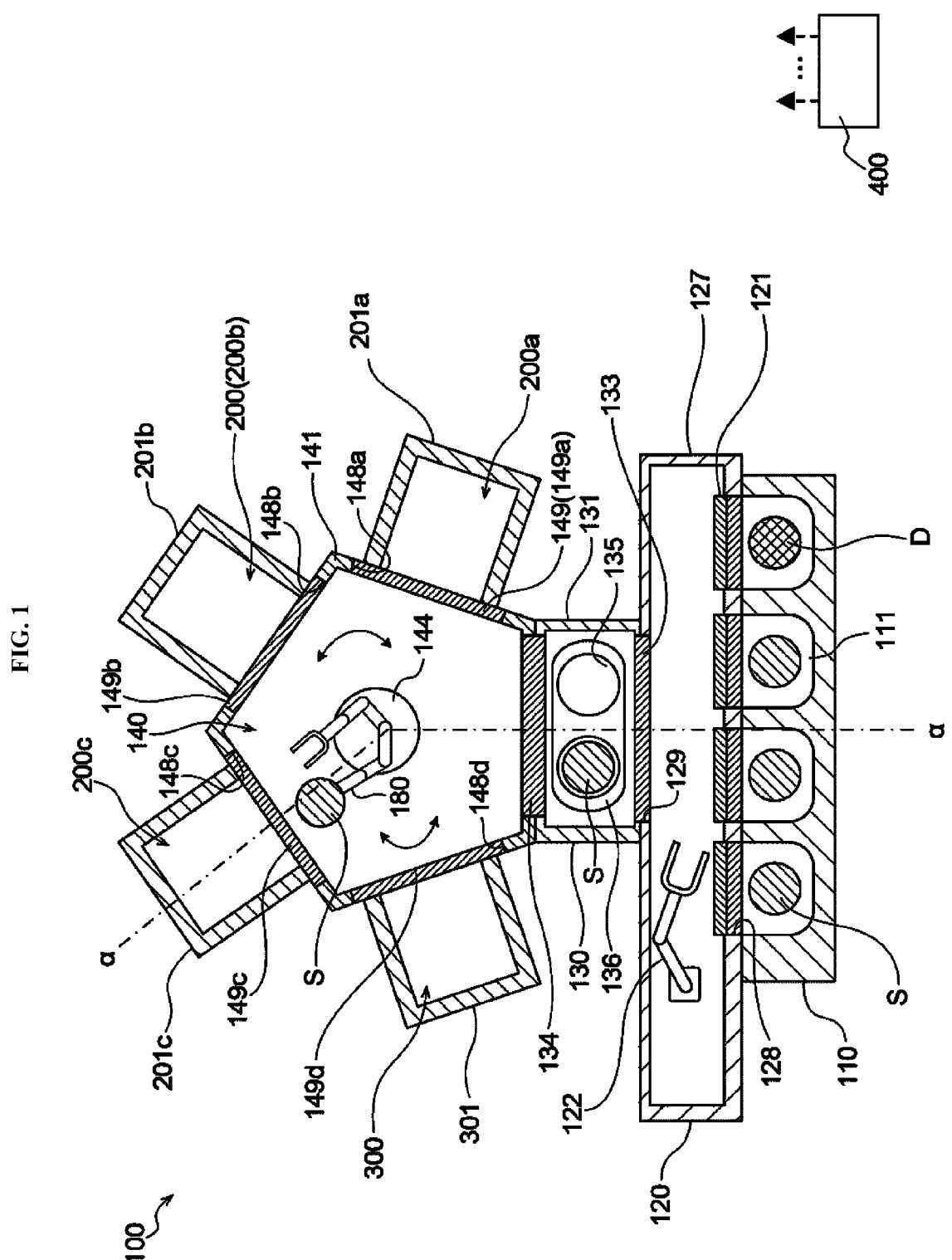
FIG. 1 is a diagram schematically illustrating an exemplary configuration of a substrate processing apparatus according to one or more embodiments of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

Figure 2:
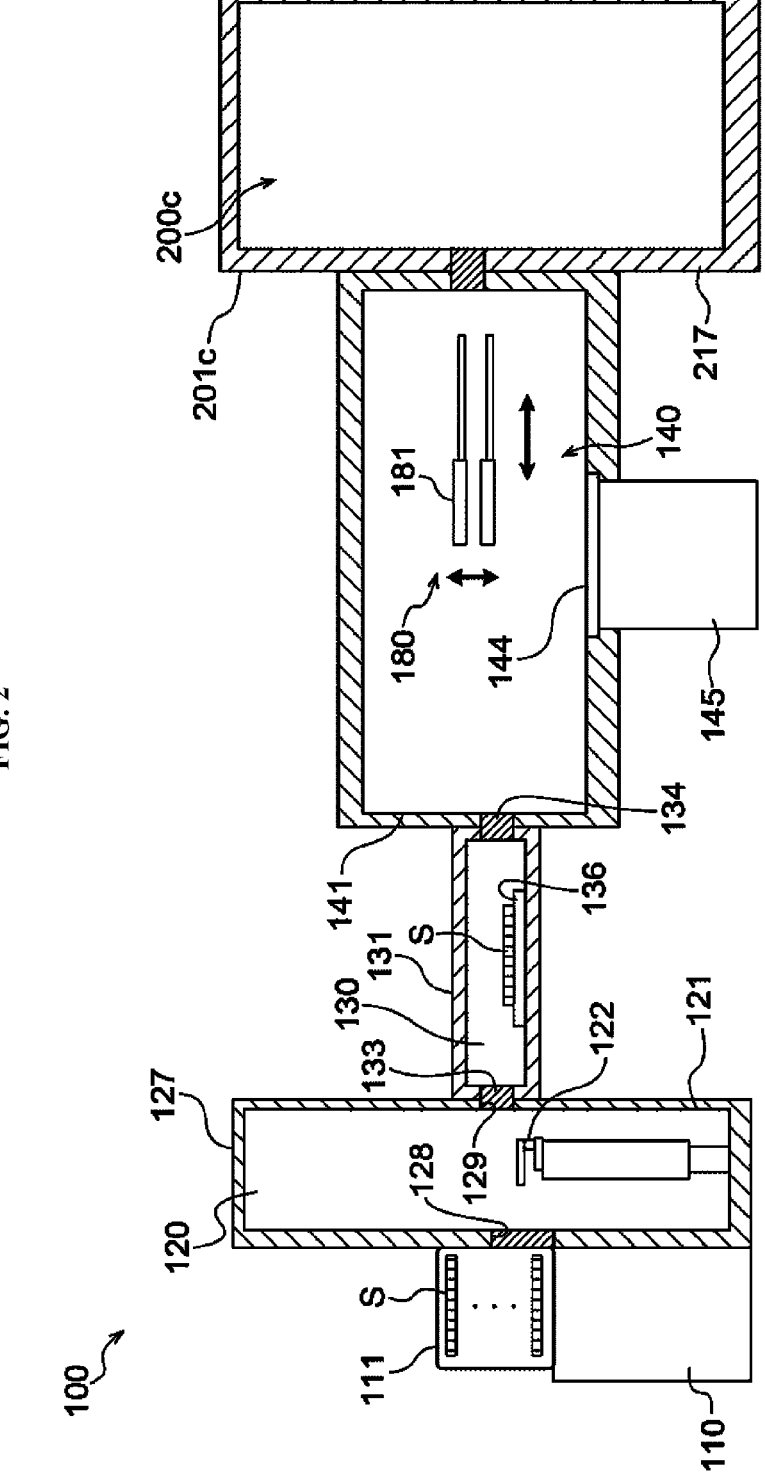
FIG. 2 is a diagram schematically illustrating a vertical cross-section of the exemplary configuration of the substrate processing apparatus according to the embodiments of the present disclosure, taken along a line a-a shown in FIG. 1.

Hereinafter, a substrate processing apparatus 100 according to the present embodiments will be described with reference to FIGS. 1 and 2. FIG. 1 is a diagram schematically illustrating a horizontal cross-section of an exemplary configuration of the substrate processing apparatus 100 according to the present embodiments. FIG. 2 is a diagram schematically illustrating a vertical cross-section of the exemplary configuration of the substrate processing apparatus 100 according to the present embodiments, taken along a line a-a shown in FIG. 1.

As shown in FIGS. 1 and 2, the substrate processing apparatus 100 to which the present embodiments are applied is configured to process a substrate S serving as a substrate (wafer). The substrate processing apparatus 100 is constituted mainly by an I/O stage (input/output stage) 110, an atmospheric transfer chamber 120, a load lock chamber 130, a vacuum transfer chamber 140, a reactor 200 and a reactor 300. Hereinafter, components of the substrate processing apparatus 100 will be described in detail.

The I/O stage (also referred to as a "loading port shelf") 110 is provided in front of the substrate processing apparatus 100. The I/O stage 110 is configured such that a plurality of pods including a pod 111 can be placed on the I/O stage 110. In the present specification, the plurality of pods including the pod 111 may be also be simply referred to as "pods 111". The pod 111 is used as a carrier for transferring the substrate S such as a silicon (Si) substrate.

The I/O stage 110 is provided adjacent to the atmospheric transfer chamber 120. The load lock chamber 130, which will be described later, is connected to a side surface of the atmospheric transfer chamber 120 other than a side surface at which the I/O stage 110 is provided. An atmospheric transfer robot 122 capable of transferring the substrate S is provided in the atmospheric transfer chamber 120.

A substrate loading/unloading port 128 through which the substrate S is transferred (loaded or unloaded) into or out of the atmospheric transfer chamber 120 and a pod opener 121 are provided at a front side of a housing 127 constituting the atmospheric transfer chamber 120. A substrate loading/unloading port 129 through which the substrate S is transferred (loaded or unloaded) into or out of the load lock chamber 130 is provided at a rear side of the housing 127 of the atmospheric transfer chamber 120. The substrate loading/unloading port 129 is opened or closed by a gate valve 133. When the substrate loading/unloading port 129 is opened by a gate valve 133, the substrate S may be transferred (or loaded) into or transferred (or unloaded) out of the load lock chamber 130.

The load lock chamber 130 is provided adjacent to the atmospheric transfer chamber 120. The vacuum transfer chamber 140, which will be described later, is provided at a side surface of a housing 131 constituting the load lock chamber 130 other than a side surface of the housing 131 that is adjacent to the atmospheric transfer chamber 120. The vacuum transfer chamber 140 is connected to the load lock chamber 130 via a gate valve 134.

A substrate mounting table 136 provided with at least two placing surfaces 135 on which the substrate S is placed is provided in the load lock chamber 130. A distance between the two placing surfaces 135 may be set based on a distance between end effectors of an arm of a transfer robot 180 described later.

The substrate processing apparatus 100 includes the vacuum transfer chamber 140, that is, a transfer space in which the substrate S is transferred under a negative pressure. For example, a housing 141 constituting the vacuum transfer chamber 140 is pentagonal when viewed from above. The load lock chamber 130 and the reactor 200 (that is, reactors 200a, 200b and 200c described later) where the substrate S is processed and the reactor 300 where the substrate S is processed are connected to respective sides of the housing 141 of a pentagonal shape. In the present specification, the reactors 200a, 200b and 200c may be collectively or individually referred to as the "reactor 200". The transfer robot 180 capable of transferring the substrate S under the negative pressure is provided approximately at a center of the vacuum transfer chamber 140 with a flange 144 as a base. The transfer robot 180 serves as a transfer structure.

The transfer robot 180 provided in the vacuum transfer chamber 140 is configured to be elevated or lowered by an elevator 145 while maintaining the vacuum transfer chamber 140 airtight by the flange 144. The elevator 145 is configured to elevate and lower two arms including an arm 181 of the transfer robot 180. In FIG. 2, for convenience of explanation, the end effectors of the arm 181 are illustrated, and a configuration such as a robot shaft connected to the flange 144 is omitted. In the present specification, the arms including the arm 181 may also be referred to as "arms 181".

The reactor 200 (that is, the reactors 200a, 200b and 200c) and the reactor 300 are connected to an outer periphery of the vacuum transfer chamber 140. The reactors 200a, 200b and 200c and the reactor 300 are arranged radially around the vacuum transfer chamber 140.

A substrate loading/unloading port 148 (see FIG. 3) is provided in each of sidewalls of the housing 141 facing the reactor 200 (that is, the reactors 200a, 200b and 200c) and the reactor 300, respectively. For example, as shown in FIG. 2, a substrate loading/unloading port 148a is provided in the sidewall of the housing 141 facing the reactor 200a. Further, as shown in FIG. 1, a substrate loading/unloading port 148b, a substrate loading/unloading port 148c and a substrate loading/unloading port 148d are provided in a manner corresponding to the reactors 200b, 200c and the reactor 300, respectively. Since configurations of the reactors 200b and 200c are the same as that of the reactor 200a, the detailed description thereof will be omitted. In the present specification, the substrate loading/unloading ports 148a through 148d may be collectively or individually referred to as the "substrate loading/unloading port 148". In addition, for example, the substrate loading/unloading port 148d and a gate valve 149d are provided in the sidewall of the housing 141 facing the reactor 300. As shown in FIG. 1, a gate valve 149a, a gate valve 149b, a gate valve 149c and the gate valve 149d are provided in a manner corresponding to the reactors 200a, 200b, 200c and the reactor 300, respectively. In the present specification, the gate valves 149a through 149d may be collectively or individually referred to as a "gate valve 149". Since the reactor 200 (that is, the reactors 200a through 200c) and the reactor 300 communicate with the vacuum transfer chamber 140, the reactor 200 and the reactor 300 are also operated at a vacuum level such that it is possible to prevent an inner atmosphere of the vacuum transfer chamber 140 from flowing into each of the reactor 200 and the reactor 300. When the substrate S is transferred (loaded or unloaded) between the vacuum transfer chamber 140 and each of the reactor 200 and the reactor 300, a pressure in each of the reactor 200 and the reactor 300 may be further adjusted (or controlled).

Subsequently, the transfer robot 180 provided in the vacuum transfer chamber 140 will be described. The transfer robot 180 includes the two arms 181. The arm 181 includes the end effectors on which the substrate S is placed.

The elevator 145 is capable of controlling an elevating operation and a rotating operation of the arm 181. The arm 181 is capable of being rotated or extended around an arm shaft (not shown). By rotating or extending the arms 181, the substrate S may be loaded into or unloaded out of the reactor 200 (that is, the reactors 200a, 200b and 200c) or the reactor 300.

<Reactor 200: Batch Type Apparatus>

Figure 3:
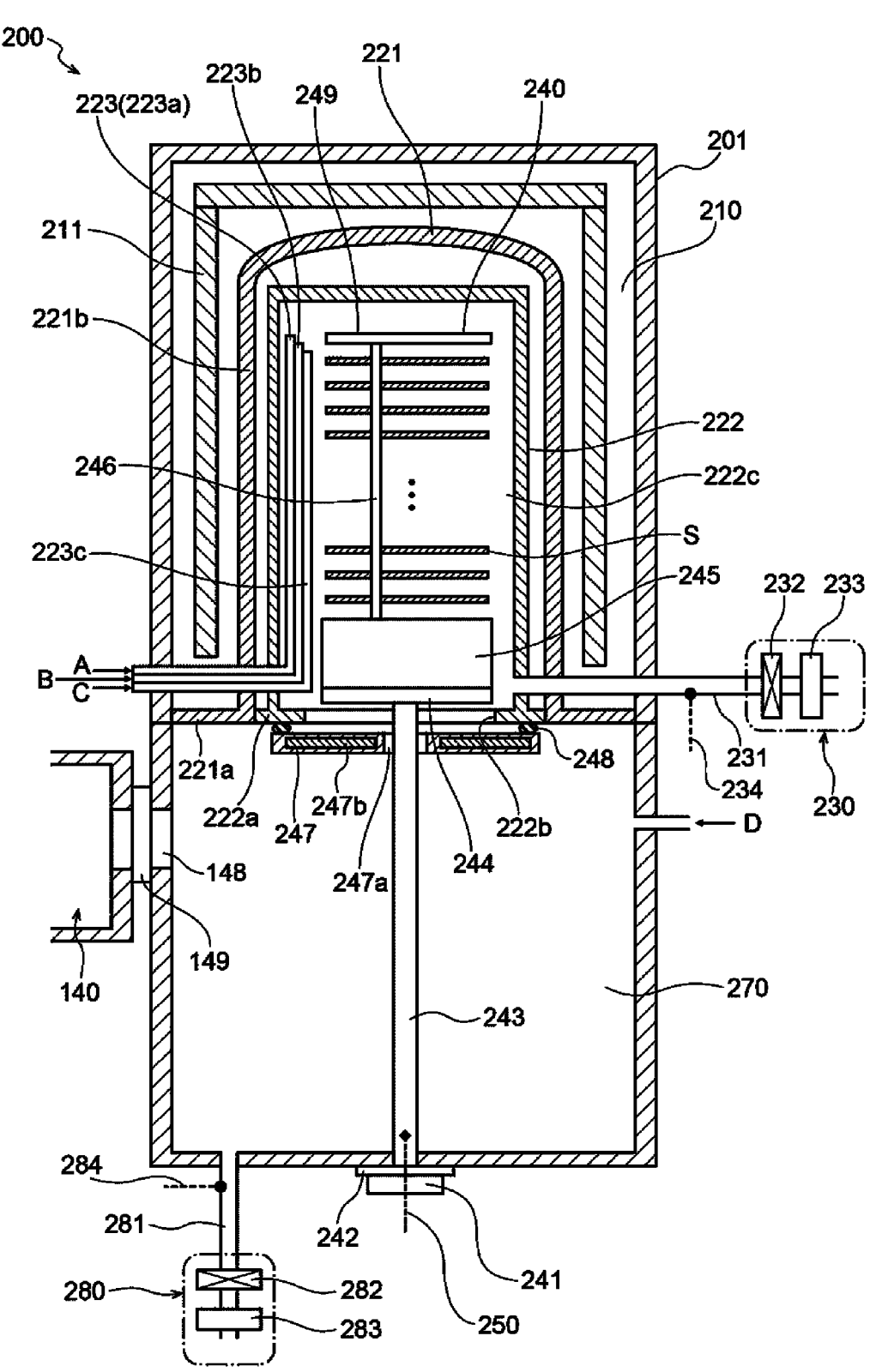
FIG. 3 is a diagram schematically illustrating an exemplary configuration of a reactor according to the embodiments of the present disclosure.

Subsequently, the reactors 200a, 200b and 200c will be described with reference to FIG. 3. Since the configurations of the reactors 200a, 200b and 200c are the same, in the following descriptions, the reactors 200a, 200b and 200c will be collectively described as the reactor 200. Each reactor 200 is configured to be capable of performing a plurality of processes. The reactor 200 will be described in detail below.

A housing 201 constituting the reactor 200 includes a reaction tube storage chamber 210 at an upper portion thereof and a transfer chamber 270 at a lower portion thereof. In the reaction tube storage chamber 210, a heater 211 and an inner reaction tube 222 are mainly provided. The transfer chamber 270 is configured to be capable of communicating with the vacuum transfer chamber 140. The substrate loading/unloading port 148 (that is, the substrate loading/unloading ports 148a through 148c) through which the substrate S is transferred into or out of the transfer chamber 270 is provided at the transfer chamber 270. The substrate loading/unloading port 148 (that is, the substrate loading/unloading ports 148a through 148c) is opened or closed by the gate valve 149 (that is, the gate valves 149a through 149c). The heater 211 is spaced apart from a wall of the inner reaction tube 222, and is arranged along the wall (which is a wall of a process chamber 222c extending in a vertical direction) of the inner reaction tube 222. The heater 211 may also be referred to as a "first heater" or a "wall heater".

The transfer chamber 270 is installed below the inner reaction tube 222, and is configured to be capable of communicating with the inner reaction tube 222. In the transfer chamber 270, the substrate S may be placed (or mounted) on a substrate support structure (hereinafter, also referred to as a "boat") 240 described later by the transfer robot 180 via the substrate loading/unloading port 148, or the substrate S may be taken (or unloaded) out of the substrate support structure 240 by the transfer robot 180 via the substrate loading/unloading port 148.

<Reaction Tube>

Subsequently, the reaction tube storage chamber 210 and the inner reaction tube 222 provided in the reaction tube storage chamber 210 will be described. A reaction tube is constituted by the inner reaction tube 222 and an outer reaction tube 221. The inner reaction tube 222 is accommodated in the outer reaction tube 221. According to the present embodiments, the outer reaction tube 221 and the inner reaction tube 222 may also be collectively referred to as a "first vessel".

The outer reaction tube 221 is provided between the inner reaction tube 222 and the heater 211. In FIG. 3, the outer reaction tube 221 and the inner reaction tube 222 are configured such that an inner atmosphere of the outer reaction tube 221 and an inner atmosphere of the inner reaction tube 222 are separated from each other. A chamber of the outer reaction tube 221, where the inner reaction tube 222 is stored, may also be referred to as an "inner reaction tube storage chamber 221b". However, the present embodiments are not limited thereto. For example, the inner atmosphere of the outer reaction tube 221 and the inner atmosphere of the inner reaction tube 222 may communicate with each other.

A flange 221a is provided at a lower portion of the outer reaction tube 221. The flange 221a is fixed to a wall constituting the reaction tube storage chamber 210. A hole is provided at a center of the flange 221a. A flange 222a of the inner reaction tube 222 is inserted into the hole and fixed. The flange 221a and the flange 222a may also be collectively referred to as a "furnace opening 222b".

An upper portion of the inner reaction tube 222 is closed, and the flange 222a is provided at a lower portion of the inner reaction tube 222. The furnace opening 222b through which the substrate support structure 240 is transferred is provided at a center of the flange 222a. That is, the flange 222a is provided at a lower portion of a wall constituting the inner reaction tube 222 and extending in the vertical direction. Since the substrate support structure 240 is transferred through the furnace opening 222b, the furnace opening 222b may also be referred to as a "substrate support loading/unloading port" or simply referred to as a "loading/unloading port". Further, the flange 222a and the furnace opening 222b may also be collectively referred to as a "substrate support loading/unloading port structure" or simply referred to as "loading/unloading port structure". The furnace opening 222b may be included in the flange 222a.

The inner reaction tube 222 is configured to be capable of accommodating the substrate S supported by the substrate support structure 240. The inner reaction tube 222 is provided with a nozzle (or nozzles) 223 serving as a part of a gas supplier (which is a gas supply structure or a gas supply system) through which a gas is supplied. The nozzle (or nozzles) 223 may be configured to extend in the vertical direction, which is an arrangement direction of a plurality of substrates including the substrate S. In the present specification, the plurality of substrates including the substrate S may also be referred to as "substrates S". The gas supplied through the nozzle (or nozzles) 223 is supplied to each of the substrates S.

For example, the nozzles 223 are provided for each gas type. The present embodiments will be described by way of an example in which three nozzles 223a, 223b and 223c are provided as the nozzles 223. Each of the nozzles 223 is arranged so as not to overlap one another in a horizontal direction. While the three nozzles 223a, 223b and 223c are illustrated as the nozzles 223 in FIG. 3 for convenience of explanation, the present embodiments are not limited thereto. For example, four or more nozzles may be provided in accordance with contents of a substrate processing.

Subsequently, the gas supplier capable of supplying the gas to each of the nozzles 223 will be described with reference to FIGS. 4A, 4B, 4C and 4D. According to the present embodiments, for example, a first gas supplier (which is a first gas supply structure or a first gas supply system) 224 and a second gas supplier (which is a second gas supply structure or a second gas supply system) 225, which will be described later, may also be collectively or individually referred to as the gas supplier.

Figure 4A:
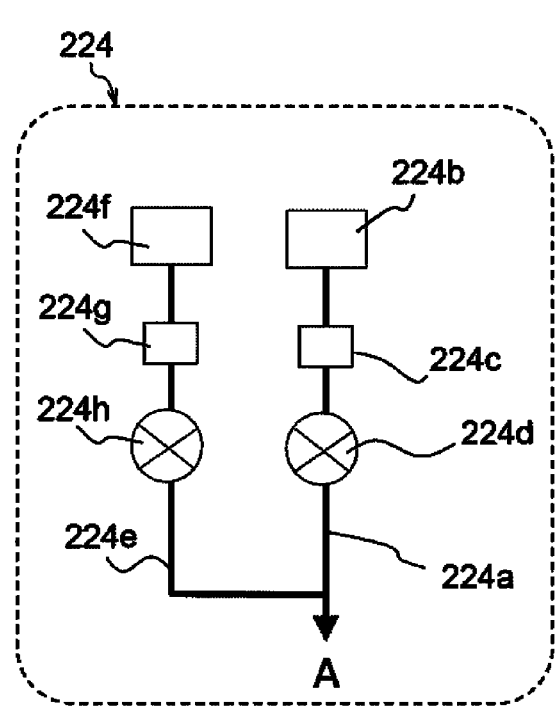
FIG. 4A is a diagram schematically illustrating an exemplary configuration of a first gas supplier included in the reactor shown in FIG. 3.

First, the first gas supplier 224 capable of supplying the gas to the nozzle 223a will be described with reference to FIG. 4A. A first gas supply source 224b, a mass flow controller (MFC) 224c serving as a flow rate controller (or a flow rate control structure) and a valve 224d serving as an opening/closing valve are sequentially provided in this order at a gas supply pipe 224a from an upstream side toward a downstream side of the gas supply pipe 224a in a gas flow direction. The gas supply pipe 224a is configured to be capable of communicating with the nozzle 223a.

The first gas supply source 224b is a source of a first gas (also referred to as a "first element-containing gas") containing a first element. The first element-containing gas serves as a source gas, which is one of process gases.

According to the present embodiments, for example, the first element is silicon (Si). More specifically, a chlorosilane source gas containing a silicon-chlorine bond (Si—Cl bond) such as hexachlorodisilane gas ($Si_2Cl_6$, abbreviated as HCDS) gas, monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane ($SiCl_4$, abbreviated as STC) gas and octachlorotrisilane ($Si_3Cl_8$, abbreviated as OCTS) gas may be used as the first element-containing gas.

The first gas supplier 224 is constituted mainly by the gas supply pipe 224a, the MFC 224c and the valve 224d. The first gas supplier 224 may also be referred to as a "silicon-containing gas supplier" (which is a silicon-containing gas supply structure or a silicon-containing gas supply system).

A gas supply pipe 224e is connected to the gas supply pipe 224a at a downstream side of the valve 224d. An inert gas supply source 224f, a mass flow controller (MFC) 224g and a valve 224h are sequentially provided in this order at the gas supply pipe 224e from an upstream side toward a downstream side of the gas supply pipe 224e in the gas flow direction. For example, an inert gas such as nitrogen ($N_2$) gas is supplied from the inert gas supply source 224f.

A first inert gas supplier (which is a first inert gas supply structure or a first inert gas supply system) is constituted mainly by the gas supply pipe 224e, the MFC 224g and the valve 224h. The inert gas supplied from the inert gas supply source 224f is used as a carrier gas or a dilution gas of the first gas in the substrate processing described later. The first gas supplier 224 may further include the first inert gas supplier.

Figure 4B:
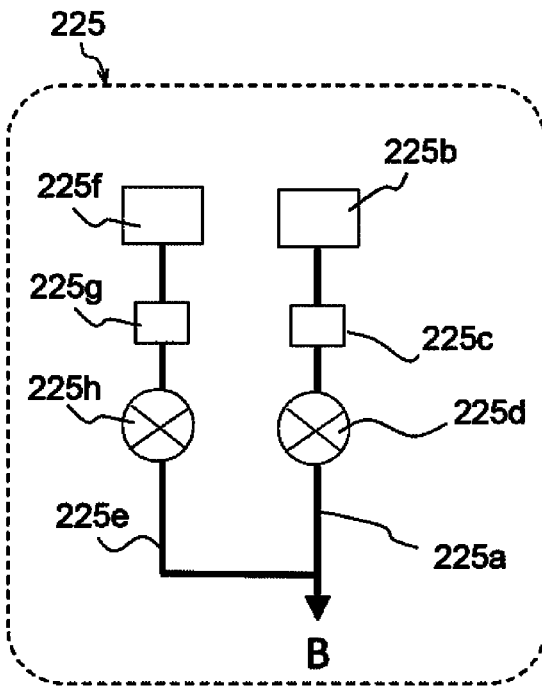
FIG. 4B is a diagram schematically illustrating an exemplary configuration of a second gas supplier included in the reactor shown in FIG. 3.

Subsequently, the second gas supplier 225 capable of supplying the gas to the nozzle 223b will be described with reference to FIG. 4B. A second gas supply source 225b, a mass flow controller (MFC) 225c and a valve 225d are sequentially provided in this order at a gas supply pipe 225a from an upstream side toward a downstream side of the gas supply pipe 225a in the gas flow direction. The gas supply pipe 225a is configured to be capable of communicating with the nozzle 223b.

The second gas supply source 225b is a source of a second gas (also referred to as a "second element-containing gas") containing a second element. The second element-containing gas serves as one of the process gases. Further, the second element-containing gas may serve as a reactive gas or a modification gas.

According to the present embodiments, for example, the second element-containing gas contains the second element different from the first element. As the second element, for example, one of oxygen (O), nitrogen (N) and carbon (C) may be used. According to the present embodiments, for example, a nitrogen-containing gas is used as the second element-containing gas. More specifically, a hydrogen nitride-based gas containing a nitrogen-hydrogen bond (N—H bond) such as ammonia ($NH_3$), diazene ($N_2H_2$) gas, hydrazine ($N_2H_4$) gas and $N_3H_8$ gas may be used as the second element-containing gas.

The second gas supplier 225 is constituted mainly by the gas supply pipe 225a, the MFC 225c and the valve 225d. The second gas supplier 225 may also be referred to as a "reactive gas supplier" (which is a reactive gas supply structure or a reactive gas supply system).

A gas supply pipe 225e is connected to the gas supply pipe 225a at a downstream side of the valve 225d. An inert gas supply source 225f, a mass flow controller (MFC) 225g and a valve 225h are sequentially provided in this order at the gas supply pipe 225e from an upstream side toward a downstream side of the gas supply pipe 225e in the gas flow direction. For example, the inert gas is supplied from the inert gas supply source 225f.

A second inert gas supplier (which is a second inert gas supply structure or a second inert gas supply system) is constituted mainly by the gas supply pipe 225e, the MFC 225g and the valve 225h. The inert gas supplied from the inert gas supply source 225f is used as a carrier gas or a dilution gas of the second gas in the substrate processing described later. The second gas supplier 225 may further include the second inert gas supplier.

Figure 4C:
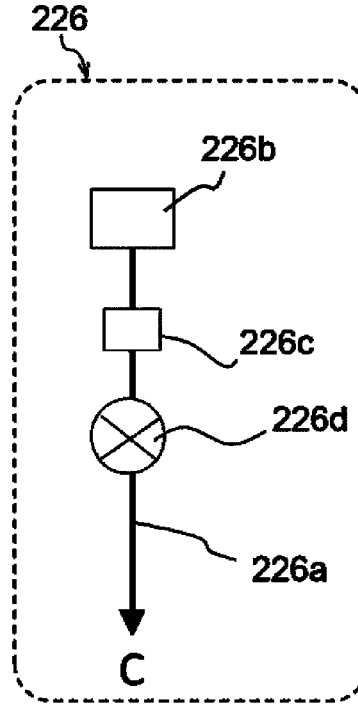
FIG. 4C is a diagram schematically illustrating an exemplary configuration of an inert gas supplier included in the reactor shown in FIG. 3.

Subsequently, an inert gas supplier (which is an inert gas supply structure or an inert gas supply system) 226 capable of supplying the gas to the nozzle 223c will be described with reference to FIG. 4C. An inert gas supply source 226b, a mass flow controller (MFC) 226c and a valve 226d are sequentially provided in this order at a gas supply pipe 226a from an upstream side toward a downstream side of the gas supply pipe 226a in the gas flow direction. The inert gas supplied from the inert gas supply source 226b may be used as a purge gas for purging the inner atmosphere of the inner reaction tube 222 or may be used as a pressure adjusting gas for adjusting an inner pressure of the inner reaction tube 222. The gas supply pipe 226a is configured to be capable of communicating with the nozzle 223c.

An exhauster (which is an exhaust structure or an exhaust system) 230 configured to exhaust the inner atmosphere of the inner reaction tube 222 includes an exhaust pipe 231 configured to be capable of communicating with the inner reaction tube 222.

A vacuum pump (not shown) serving as a vacuum exhaust apparatus is connected to the exhaust pipe 231 via a valve 232 serving as an opening/closing valve and an APC (Automatic Pressure Controller) valve 233 serving as a pressure regulator (which is a pressure adjusting structure). Thereby, the inner reaction tube 222 is vacuum-exhausted such that the inner pressure of the inner reaction tube 222 reaches and is maintained at a predetermined pressure (vacuum degree). The exhauster 230 is provided with a pressure detector 234. The pressure detector 234 is configured to be capable of detecting the inner pressure of the inner reaction tube 222. The exhauster 230 may also be referred to as a "process chamber exhauster" (which is a process chamber exhaust structure or a process chamber exhaust system) so as to distinguish the exhauster 230 from an exhauster (which is an exhaust structure or an exhaust system) 280 provided in the transfer chamber 270, which will be described later.

The inner pressure of the inner reaction tube 222 is adjusted by cooperation between the gas supplier and the exhauster 230 described above. When adjusting the inner pressure of the inner reaction tube 222, for example, the inner pressure of the inner reaction tube 222 is adjusted such that a pressure value detected by the pressure detector 234 is set to be a predetermined value. Since an inner atmosphere of the first vessel can be adjusted by the gas supplier and the exhauster 230 as described above, according to the present embodiments, the gas supplier and the exhauster 230 may also be collectively referred to as a "first atmosphere controller".

A region in the inner reaction tube 222, in which the substrate S is accommodated, may also be referred to as a "process region" or a "substrate processing region", and a configuration constituting the process region may also be referred to as the "process chamber 222c". According to the present embodiments, the process chamber 222c is defined by the inner reaction tube 222.

<Substrate Support (Boat)>

A substrate support is constituted by at least the substrate support structure 240. The substrate S is transferred into or out of the substrate support structure 240 through the substrate loading/unloading port 148 by the transfer robot 180 in the transfer chamber 270. Further, the substrate support structure 240 transfers the substrate S accommodated therein into the inner reaction tube 222. Then, the substrate processing such as a process of forming a film on a surface of the substrate S (also referred to as a "film-forming process") is performed in the inner reaction tube 222.

The substrate support structure 240 includes an elevator 241 serving as a first driving structure capable of driving the substrate support structure 240 in the vertical direction. In FIG. 3, the substrate support structure 240 elevated by the elevator 241 and accommodated in the inner reaction tube 222 is illustrated. Further, the substrate support structure 240 includes a rotation driver 242 serving as a second driving structure capable of driving the substrate support structure 240 to rotate.

Each driving structure described above is connected to a shaft 243 configured to support a support base 244. The support base 244 is provided with a plurality of support columns 246 capable of supporting the substrate S. The plurality of support columns 246 are configured to support a top plate 249. In FIG. 3, for convenience of explanation, one support column among the plurality of support columns 246 is illustrated. A plurality of substrate support components are provided on each of the plurality of support columns 246 at a predetermined interval therebetween in the vertical direction, and the plurality of substrates S are supported by the plurality of substrate support components, respectively. Lower portions of the plurality of support columns 246 are covered with a heat insulating cover 245. The heat insulating cover 245 is configured to be capable of suppressing a transfer of a heat in the substrate processing region to the vicinity of the furnace opening 222b. Thereby, it is possible to uniformize an inner temperature of the substrate processing region.

The substrate support structure 240 supports the substrates S (for example, five substrates) in a multistage manner along the vertical direction by the plurality of support columns 246. The top plate 249 and the plurality of support columns 246 are made of a material such as quartz and silicon carbide (SiC). The present embodiments will be described by way of an example in which seven substrates are supported by the substrate support structure 240 as the substrates S. However, the present embodiments are not limited thereto. For example, the substrate support structure 240 may be configured to support about five substrates to fifty substrates as the substrates S.

The substrate support structure 240 is moved in the vertical direction between the inner reaction tube 222 and the transfer chamber 270 by the elevator 241, and is driven by the rotation driver 242 in a rotation direction around a center of the substrate S supported by the substrate support structure 240.

A lid 247 capable of closing the furnace opening 222b is fixed to the shaft 243 via a fixing structure 247a. A diameter of the lid 247 is set to be greater than a diameter of the furnace opening 222b. A heater 247b capable of heating the lid 247 is provided at the lid 247. An O-ring 248 serving as a seal is provided on the flange 222a of the inner reaction tube 222. The heater 247b serves as an auxiliary configuration for uniformizing the inner temperature of the inner reaction tube 222 in the vertical direction. By turning on the heater 247b, it is possible to maintain a temperature of a substrate (among the substrates S) arranged at a lower portion of the substrate support structure 240 substantially equal to a temperature of a substrate (among the substrates S) arranged at an upper portion of the substrate support structure 240. The heater 247b may also be referred to as a "second heater" or a "lid heater".

For example, when the substrate S is processed, the lid 247 closes the furnace opening 222b. When the lid 247 closes the furnace opening 222b, as shown in FIG. 3, the elevator 241 elevates the lid 247 such that an upper surface of the lid 247 is set at a position where the lid 247 is pressed against the flange 222a. As a result, it is possible to maintain an inner portion of the inner reaction tube 222 airtight. As will be described later, according to the present embodiments, since an inner pressure of the transfer chamber 270 is set to be higher than an inner pressure of the process chamber 222c, the O-ring 248 is crushed and deformed. Thereby, the O-ring 248 is crimped to the flange 222a.

The present embodiments are described by way of an example in which the O-ring 248 is provided on the flange 222a of the inner reaction tube 222. However, the present embodiments are not limited thereto. For example, the O-ring 248 may be provided on the flange 221a of the outer reaction tube 221. In such a case, the diameter of the lid 247 is set to be greater than a diameter of the O-ring 248 provided on the flange 221a of the outer reaction tube 221. Further, the O-ring 248 may be provided at the lid 247. In such a case, when the O-ring 248 is replaced with a new one, it is possible to replace the O-ring 248 for each lid 247. Thereby, it is possible to easily perform a maintenance operation.

<Transfer Chamber>

The transfer chamber 270 will be explained. The transfer chamber 270 is provided below the reaction tube storage chamber 210. In the transfer chamber 270, the substrate S may be placed (or mounted) on the substrate support structure 240 by the transfer robot 180 via the substrate loading/unloading port 148, or the substrate S may be taken (or unloaded) out of the substrate support structure 240 by the transfer robot 180 via the substrate loading/unloading port 148. The transfer chamber 270 may also be referred to as a "second vessel".

A hole through which the shaft 243 penetrates is provided on a bottom wall of the transfer chamber 270. Further, the exhauster 280 configured to exhaust an inner atmosphere of the transfer chamber 270 is provided at the transfer chamber 270. The exhauster 280 includes an exhaust pipe 281 connected to the transfer chamber 270 and configured to be capable of communicating with an inside of the transfer chamber 270.

A vacuum pump (not shown) serving as a vacuum exhaust apparatus is connected to the exhaust pipe 281 via a valve 282 serving as an opening/closing valve and an APC (Automatic Pressure Controller) valve 283 serving as a pressure regulator (which is a pressure adjusting structure). Thereby, the transfer chamber 270 is vacuum-exhausted such that the inner pressure of the transfer chamber 270 reaches and is maintained at a predetermined pressure (vacuum degree). The exhauster 280 may also be referred to as a "transfer chamber exhauster". The exhauster 280 is provided with a pressure detector 284. The pressure detector 284 is configured to be capable of detecting the inner pressure of the transfer chamber 270. Since the exhauster 280 is configured to be capable of controlling the inner atmosphere of the transfer chamber 270 as described above, the exhauster 280 may also be referred to as a "second atmosphere controller".

Figure 4D:
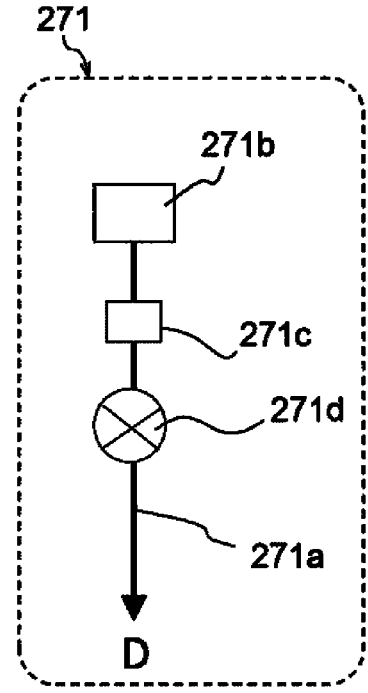
FIG. 4D is a diagram schematically illustrating an exemplary configuration of another inert gas supplier included in the reactor shown in FIG. 3.

An inert gas supplier (which is an inert gas supply structure or an inert gas supply system) 271 shown in FIG. 4D may be connected to the transfer chamber 270. As shown in FIG. 4D, an inert gas supply source 271b, a mass flow controller (MFC) 271c and a valve 271d are sequentially provided in this order at a gas supply pipe 271a from an upstream side toward a downstream side of the gas supply pipe 271a in the gas flow direction. The inert gas supplied from the inert gas supply source 271b may be used as a purge gas for purging the inner atmosphere of the transfer chamber 270 or may be used as a pressure adjusting gas for adjusting the inner pressure of the transfer chamber 270. The inert gas supplier 271 may also be referred to as a third gas supplier (which is a third gas supply structure or a third gas supply system). Since the inert gas supplier 271 is capable of controlling the inner atmosphere of the transfer chamber 270 in cooperation with the exhauster 280, the second atmosphere controller may further include the inert gas supplier 271.

<Reactor 300: Single Wafer Type Apparatus>

Figure 5:
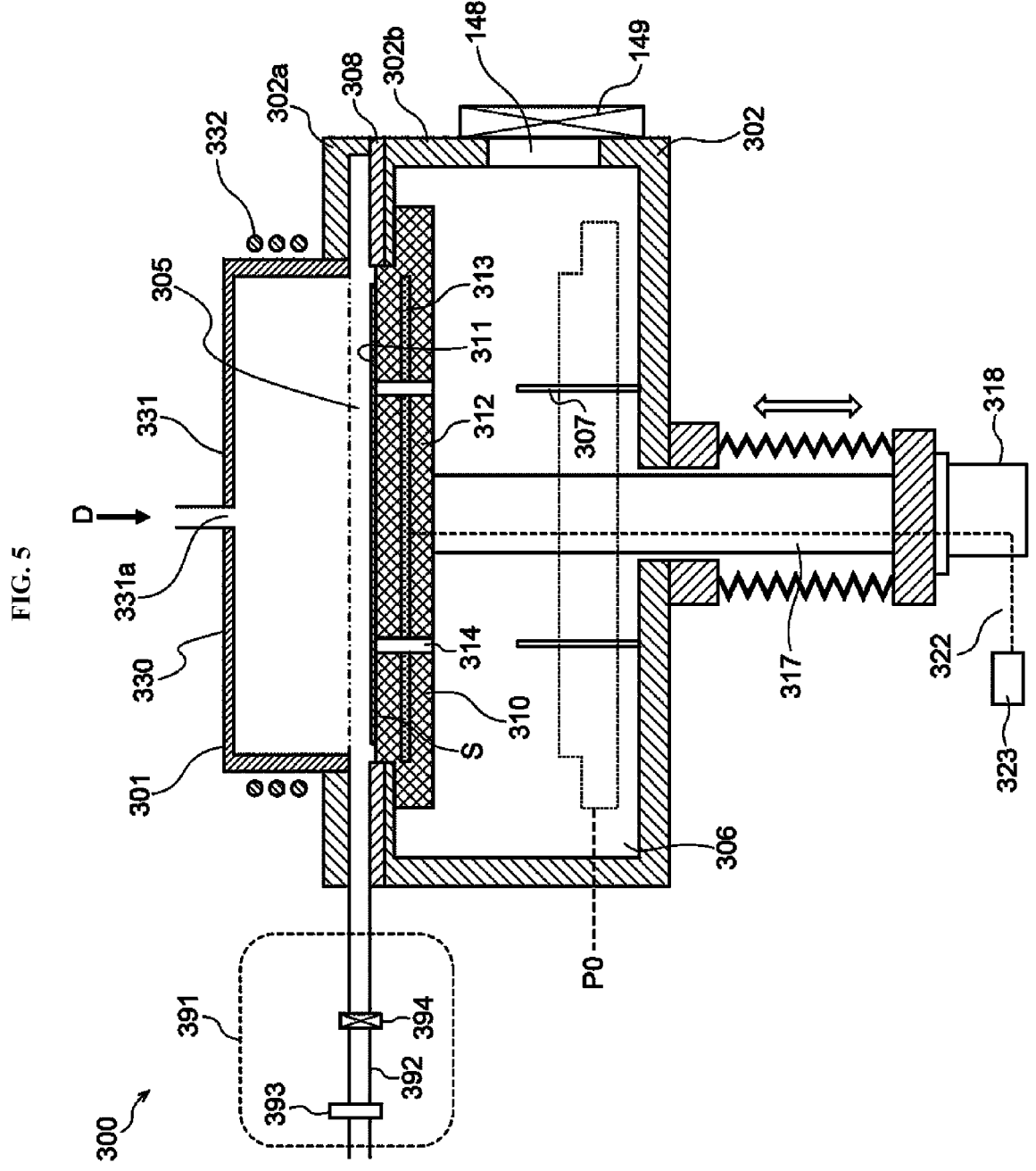
FIG. 5 is a diagram schematically illustrating the reactor according to the embodiments of the present disclosure.

Subsequently, the reactor 300 will be described in detail with reference to FIG. 5. As shown in FIG. 5, the reactor 300 includes a vessel 302. A process chamber 301 defining a process space 305 in which the substrate S is processed and a transfer chamber 306 defining a transfer space through which the substrate S is transferred into or out of the process space 305 are provided in the vessel 302. The vessel 302 is constituted by an upper vessel 302a and a lower vessel 302b. A partition plate 308 is provided between the upper vessel 302a and the lower vessel 302b. The vessel 302 may also be referred to as a "third vessel".

The substrate loading/unloading port 148 (that is, the substrate loading/unloading port 148d) is provided adjacent to the gate valve 149 (that is, the gate valve 149d) at a side surface of the lower vessel 302b. The substrate S is transferred between the transfer chamber 306 and the vacuum transfer chamber 140 through the substrate loading/unloading port 148. A plurality of lift pins 307 are provided at a bottom of the lower vessel 302b.

A substrate support 310 configured to support the substrate S is provided in the process space 305. The substrate support 310 mainly includes: a substrate mounting table 312 provided with a substrate placing surface 311 on which the substrate S is placed; and a heater 313 which is a heating structure embedded in the substrate mounting table 312. A plurality of through-holes 314 through which the plurality of lift pins 307 penetrate are provided at positions on the substrate mounting table 312 corresponding to the plurality of lift pins 307.

Wiring 322 configured to supply the electric power to the heater 313 is connected to the heater 313. The wiring 322 is connected to a heater controller 323. The heater controller 323 is electrically connected to a controller 400. The controller 400 is configured to control the heater controller 323 to operate the heater 313.

The substrate mounting table 312 is supported by a shaft 317. The shaft 317 penetrates a bottom of the vessel 302, and is connected to an elevator 318 at an outside of the vessel 302. The substrate S placed on the substrate placing surface 311 of the substrate mounting table 312 is capable of being elevated or lowered by operating the elevator 318 to elevate or lower the shaft 317 and the substrate mounting table 312.

For example, the process chamber 301 is constituted by a plasma generation chamber 330 described later and the substrate mounting table 312. Further, the process chamber 301 may be configured by another structure as long as the process space 305 in which the substrate S is processed can be secured.

When the substrate S is transferred, the substrate mounting table 312 is lowered until the substrate placing surface 311 faces the substrate loading/unloading port 148, that is, the substrate placing surface 311 reaches a transfer position P0. When the substrate S is processed, the substrate mounting table 312 is elevated until the substrate S reaches a processing position (also referred to as a "substrate processing position") in the process space 305 as shown in FIG. 5.

The plasma generation chamber 330 capable of converting the gas into a plasma state is provided at an upper portion (or an upstream side) of the process space 305. A fourth gas supplier (which is a fourth gas supply structure or a fourth gas supply system) 340 described later is connected to a lid 331 so as to communicate with a gas introduction hole 331a provided in the lid 331 of the plasma generation chamber 330. A coil 332 is arranged around the plasma generation chamber 330. An electrode (not shown) is connected to the coil 332. By supplying the electric power through the electrode, it is possible to convert the gas supplied into the plasma generation chamber 330 into the plasma state.

Subsequently, an exhauster (which is an exhaust structure or an exhaust system) 391 will be described. An exhaust pipe 392 is configured to be capable of communicating with the process space 305. The exhaust pipe 392 is connected to the upper vessel 302a so as to communicate with the process space 305. The exhaust pipe 392 is provided with an APC 393 serving as a pressure controller capable of controlling an inner pressure of the process space 305 to a predetermined pressure. The APC 393 includes a valve body (not shown) whose opening degree is capable of being adjusted. The APC 393 is configured to adjust a conductance of the exhaust pipe 392 in response to an instruction from the controller 400. A valve 394 is provided at the exhaust pipe 392 at a downstream side of the APC 393. A dry pump (not shown) is provided at an upstream side of the exhaust pipe 392. The dry pump is configured to exhaust an inner atmosphere of the process space 305 through the exhaust pipe 392.

Figure 6:
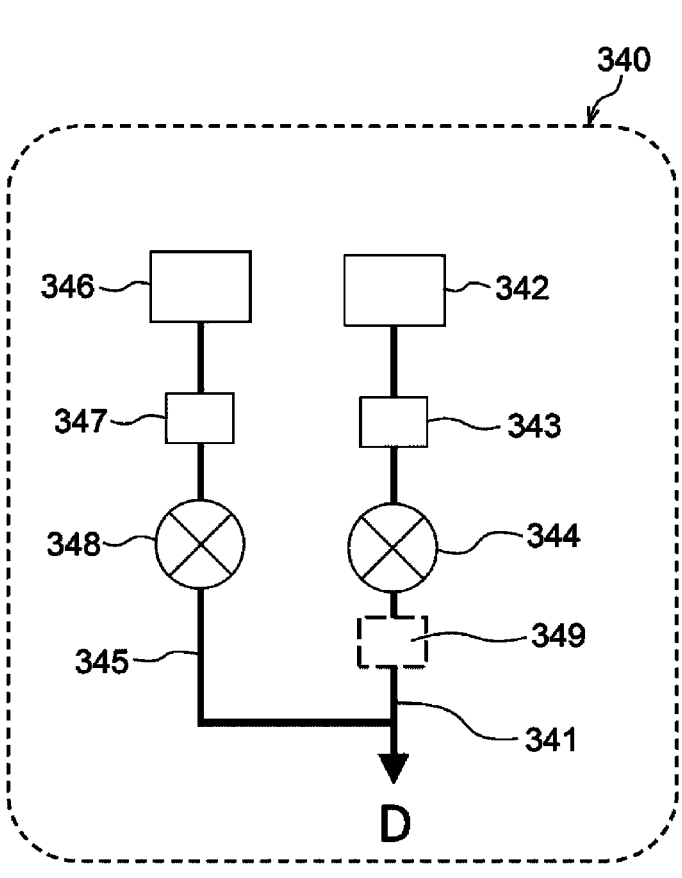
FIG. 6 is a diagram schematically illustrating an exemplary configuration of a fourth gas supplier included in the reactor shown in FIG. 5.

Subsequently, the fourth gas supplier 340 capable of supplying the gas to the process chamber 301 will be described with reference to FIG. 6. A fourth gas supply source 342, a mass flow controller (MFC) 343 serving as a flow rate controller (or a flow rate control structure) and a valve 344 serving as an opening/closing valve are sequentially provided in this order at a gas supply pipe 341 from an upstream side toward a downstream side of the gas supply pipe 341 in the gas flow direction. Further, a plasma generator 349 may be provided at the gas supply pipe 341 as shown in FIG. 6. Further, an inert gas supply pipe 345 is connected to the gas supply pipe 341. An inert gas supply source 346, a mass flow controller (MFC) 347 and a valve 348 serving as an opening/closing valve are sequentially provided in this order at the inert gas supply pipe 345 from an upstream side toward a downstream side of the inert gas supply pipe 345 in the gas flow direction.

The fourth gas supply source 342 is a source of a third gas (also referred to as a "third element-containing gas") containing a third element. For example, the third element-containing gas may refer to a gas reacting with the film formed on the substrate S. The third element-containing gas may be considered as a modification gas.

According to the present embodiments, as the third element, for example, one of oxygen (O), nitrogen (N), carbon (C) and hydrogen (H) may be used. According to the present embodiments, for example, a hydrogen-containing gas is used as the third element-containing gas. More specifically, hydrogen ($H_2$) gas may be used as the hydrogen-containing gas.

When the third gas is supplied to the process chamber 301, the inert gas serving as a dilution gas or a carrier gas of the third gas may be supplied to the process chamber 301.

The fourth gas supplier 340 is constituted mainly by the gas supply pipe 341, the MFC 343 and the valve 344. The fourth gas supplier 340 may further include an inert gas supplier (which is an inert gas supply structure or an inert gas supply system) constituted mainly by the inert gas supply pipe 345, the MFC 347 and the valve 348.

<Controller>

Figure 7:
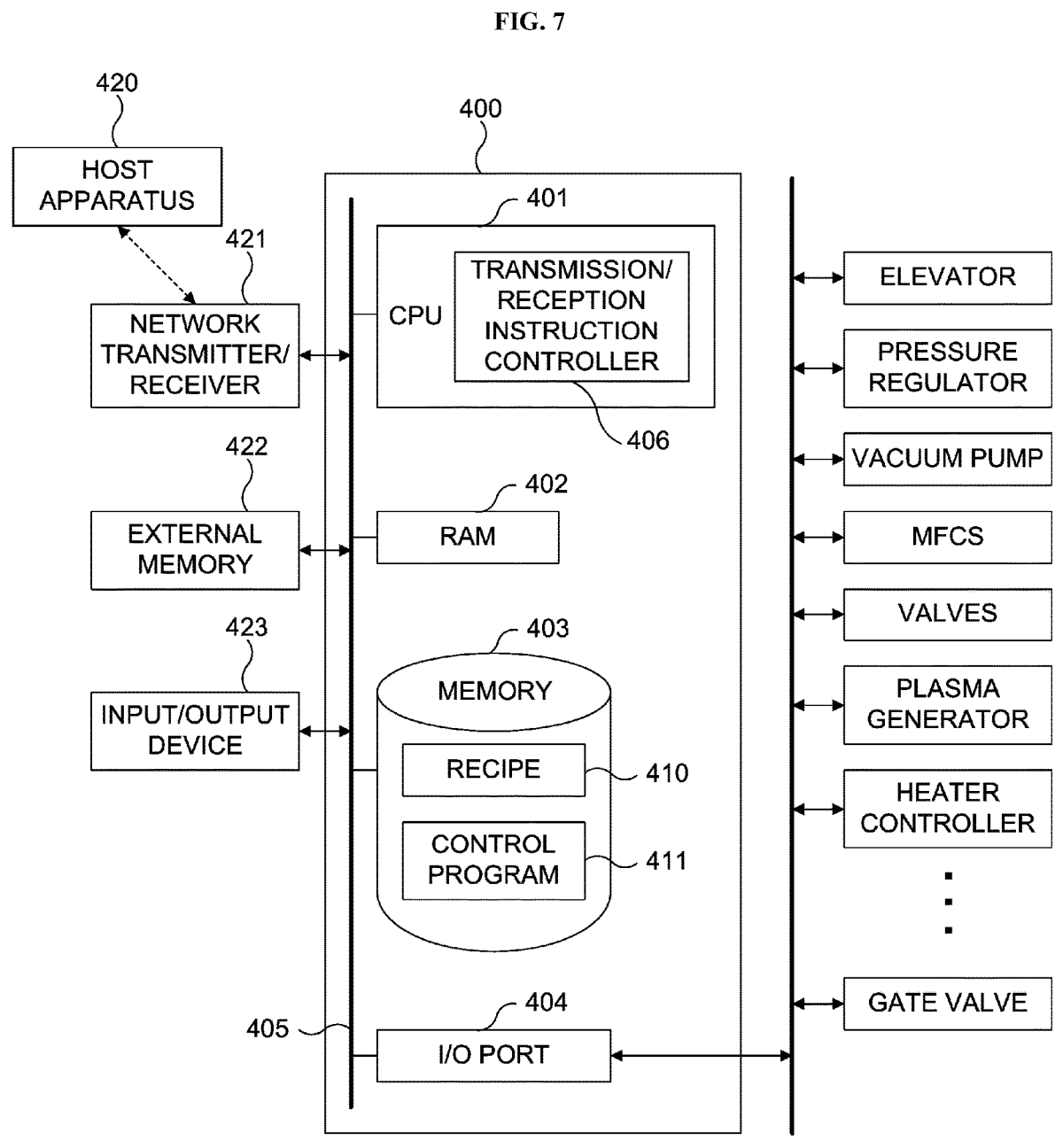

Subsequently, the controller 400 will be described with reference to FIG. 7. The substrate processing apparatus 100 includes the controller 400 configured to control operations of components constituting the substrate processing apparatus 100.

The controller 400 serving as a control apparatus or a control structure may be embodied by a computer including a CPU (Central Processing Unit) 401, a RAM (Random Access Memory) 402, a memory 403 serving as a storage and an I/O port (input/output port) 404. The RAM 402, the memory 403 and the I/O port 404 may exchange data with the CPU 401 via an internal bus 405. Transmission/reception of data in the substrate processing apparatus 100 may be performed by an instruction from a transmission/reception instruction controller 406, which is also one of functions of the CPU 401.

The CPU 401 is configured to read and execute a control program 411 from the memory 403 and read a process recipe from the memory 403 in accordance with an instruction such as an operation command inputted from an input/output device 423. In accordance with contents of the read process recipe from the input/output device 423, the CPU 401 is configured to be capable of controlling various operations such as an opening and closing operation of the gate valve 149, an ON/OFF control operation of each pump described above, a flow rate adjusting operation of each MFC described above and an opening/closing operation of each valve described above.

The memory 403 may be embodied by a component such as a flash memory and a HDD (hard disk drive). For example, a recipe 410 such as the process recipe in which information such as sequences and conditions of the substrate processing described later is stored and the control program 411 for controlling the operations of the substrate processing apparatus 100 is stored may be readably stored in the memory 403.

The process recipe is obtained by combining the sequences (steps) of the substrate processing described later such that the controller 400 can execute the steps to acquire a predetermined result, and functions as a program. For example, the process recipe is prepared for each reactor described above, and is read for each reactor described above.

Hereinafter, the process recipe and the control program may be collectively or individually referred to simply as a "program." Thus, in the present specification, the term "program" may refer to the process recipe alone, may refer to the control program alone, or may refer to both of the process recipe and the control program. The RAM 402 serves as a memory area (work area) in which the program or the data read by the CPU 401 can be temporarily stored.

The I/O port 404 is electrically connected to the components of the substrate processing apparatus 100 described above such as the gate valve 149, each pressure regulator described above, each pump described above and the heater controller 323. Further, a network transmitter/receiver 421 connected to a host apparatus 420 via a network is provided.

For example, the controller 400 according to the present embodiments may be embodied by preparing an external memory 422 storing the program described above therein and by installing the program onto the computer by using the external memory 422. For example, the external memory 422 may include a magnetic disk such as a hard disk, an optical disk such as a DVD, a magneto-optical disk such as an MO or a semiconductor memory such as a USB memory.

Further, a method of providing the program to the computer is not limited to the external memory 422. For example, the program may be directly provided to the computer by a communication interface such as the Internet and a dedicated line instead of the external memory 422. The memory 403 and the external memory 422 may be embodied by a non-transitory computer-readable recording medium. Hereinafter, the memory 403 and the external memory 422 may be collectively or individually referred to as a recording medium. Thus, in the present specification, the term "recording medium" may refer to the memory 403 alone, may refer to the external memory 422 alone, or may refer to both of the memory 403 and the external memory 422.

(2) Substrate Processing

Figure 8:
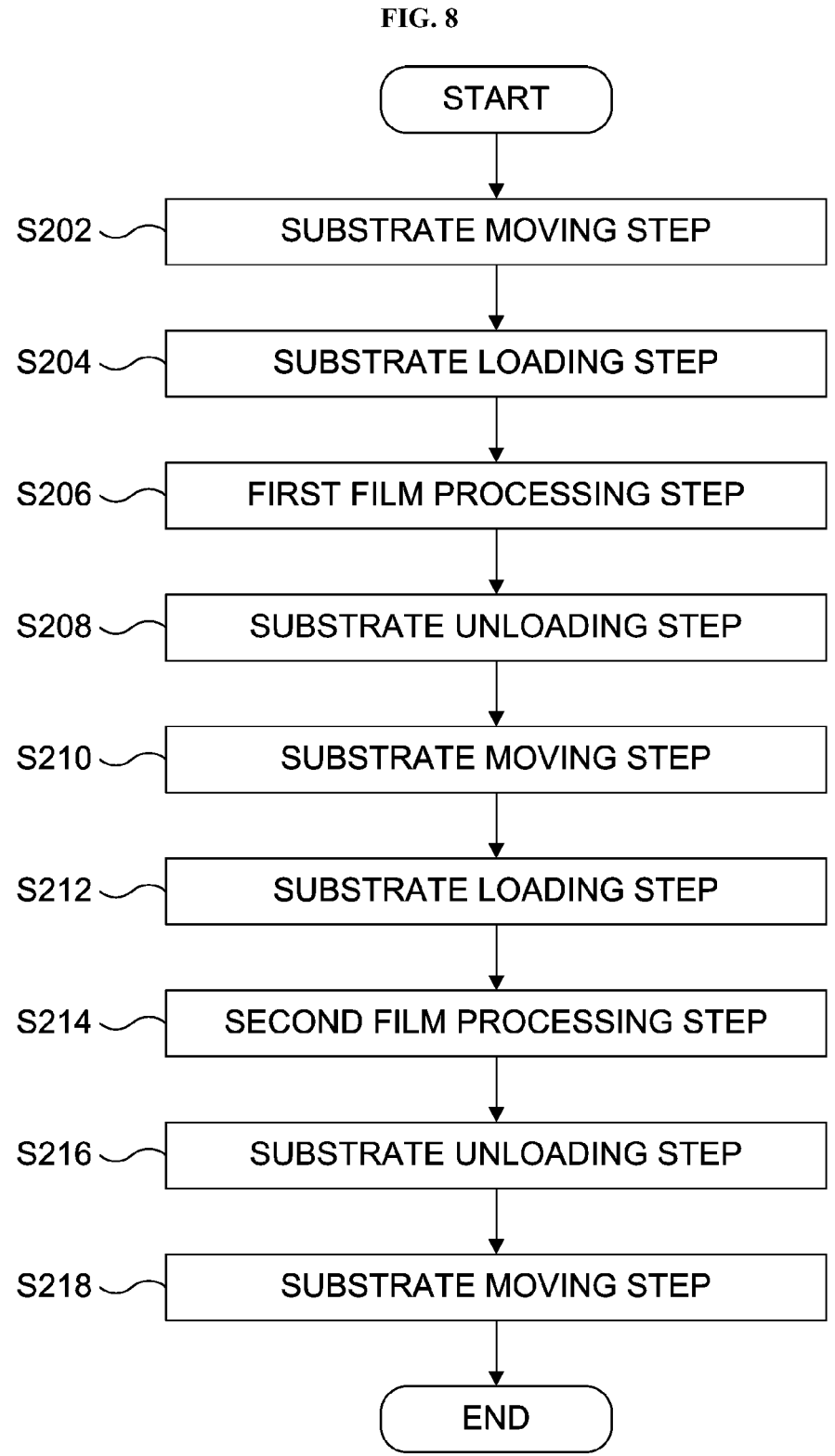
FIG. 8 is a flow chart schematically illustrating a substrate processing according to the embodiments of the present disclosure.

Subsequently, the substrate processing will be described with reference to FIG. 8. As a part of a processing performed in the substrate processing apparatus 100, the substrate processing of processing the substrate S by using the substrate processing apparatus 100 described above will be described. In the following description, the controller 400 controls the operations of the components constituting the substrate processing apparatus 100.

<Substrate Moving Step S202>

A substrate moving step S202 will be described. The substrate processing apparatus 100 receives a FOUP (front opening unified pod) such as the pod 111 in which the plurality of substrates S are stored by using a robot provided in a factory. The atmospheric transfer robot 122 picks up the substrate S from the FOUP and transfers the substrate S into the load lock chamber 130. An inner atmosphere of the load lock chamber 130 is replaced such that an inner pressure of the load lock chamber 130 is adjusted from an atmospheric pressure to a pressure substantially equal to an inner pressure of the vacuum transfer chamber 140. Thereafter, the gate valve 134 is opened, and the transfer robot 180 picks up the substrate S in the load lock chamber 130.

<Substrate Loading Step S204>

The transfer robot 180 moves the substrate S from the vacuum transfer chamber 140 to the reactor 200 (that is, one of the reactors 200a, 200b and 200c). When moving the substrate S, the inner pressure of the transfer chamber 270 is set to be equal to or lower than the inner pressure of the vacuum transfer chamber 140 so as to prevent the inner atmosphere of the transfer chamber 270 from flowing into the vacuum transfer chamber 140. In the substrate loading step S204, for example, the exhauster 280 is controlled to adjust the inner pressure of the transfer chamber 270.

Subsequently, with the substrate support structure 240 lowered into the transfer chamber 270, the gate valve 149 of the reactor 200 is opened. When opening the gate valve 149, for example, a height of the substrate support structure 240 is adjusted such that an uppermost substrate support component among the plurality of substrate support components and the substrate loading/unloading port 148 are provided at the same height.

By extending the arm 181, the transfer robot 180 supports the substrate S on the uppermost substrate support component. Thereafter, the arm 181 is retracted and the gate valve 149 of the reactor 200 is closed.

After placing a substrate such as the substrate S on a substrate support component such as the uppermost substrate support component, the height of the substrate support structure 240 is adjusted such that a substrate support component (which is provided below the substrate support component such as the uppermost substrate support component on which the substrate such as the substrate S is already supported) and the substrate loading/unloading port 148 are provided at the same height. On the other hand, the transfer robot 180 picks up a new substrate S among the substrates S transferred into the load lock chamber 130 and waits until the substrate S (that is, the new substrate S) is capable of being transferred into the reactor 200. Thereafter, the gate valve 149 is opened in the same manner as described above, and the transfer robot 180 places the substrate S (that is, the new substrate S) on the substrate support structure 240.

By repeatedly performing an operation described above a predetermined number of times, a predetermined number of substrates S can be placed on the substrate support structure 240. After the predetermined number of substrates S are placed on the substrate support structure 240, the gate valve 149 is closed and the substrate support structure 240 is further elevated such that the substrate support structure 240 is transferred (or loaded) into the inner reaction tube 222 as shown in FIG. 3. When elevating the substrate support structure 240, the lid 247 is elevated together with the substrate support structure 240, and the O-ring 248 is pressed against the lid 247. As a result, an inside of the inner reaction tube 222 is sealed. Further, the heater 211 is in an operating state, and is maintained at a substrate processing temperature serving as a first temperature described later.

Subsequently, the inner pressure of the inner reaction tube 222 is adjusted (or set) to a predetermined pressure by cooperation between the inert gas supplier 226 and the exhauster 230. Further, in parallel with adjusting the inner pressure of the inner reaction tube 222, the inert gas supplier 271 and the exhauster 280 are controlled such that the inner pressure of the transfer chamber 270 is higher than the inner pressure of the inner reaction tube 222. Thereby, it is possible to suppress a movement of the inner atmosphere of the inner reaction tube 222 to the transfer chamber 270.

<First Film Processing Step S206>

Subsequently, a first film processing step S206 will be described. The first film processing step S206 is a step of processing the film formed on the substrate S in the reactor 200. When the inner pressure of the process chamber 222c defined by the inner reaction tube 222 reaches a desired pressure, by controlling the first gas supplier 224 and the second gas supplier 225, the first gas and the second gas are supplied to the substrate S in the inner reaction tube 222 so as to process the substrate S. In the first film processing step S206, for example, a process performed on the substrate S refers to a process in which the first gas and the second gas are reacted with each other to form a predetermined film on the substrate S. According to the present embodiments, for example, the HCDS gas is supplied as the first gas and the NH₃ gas is supplied as the second gas to form a silicon nitride film (hereinafter, also referred to as a "SiN film"). When forming the SiN film, with the gate valve 149 closed, the inert gas supplier 271 and the exhauster 280 are controlled such that the inner pressure of the transfer chamber 270 is maintained higher than the inner pressure of the inner reaction tube 222. Thereby, it is possible to suppress a movement of the lid 247 even while the process of the first film processing step S206 is being performed. As a result, it is possible to suppress the movement of the inner atmosphere of the inner reaction tube 222 to the transfer chamber 270.

For example, process conditions of the present step are as follows:

The first gas: HCDS gas;

A gas supply amount of the first gas: from 5 sccm to 5,000 sccm;

The second gas: the NH₃ gas;

A gas supply amount of the second gas: from 10 sccm to 10,000 sccm;

The inner pressure of the process chamber 222c: from 133 Pa to 13,332 Pa; and A processing temperature: 300° C. to 500° C.

After a predetermined time has elapsed, a supply of the first gas through the first gas supplier 224 and a supply of the second gas through the second gas supplier 225 are stopped. Further, the inert gas is supplied through the inert gas supplier 226 to exhaust an inner atmosphere of the process chamber 222c.

<Substrate Unloading Step S208>

A substrate unloading step S208 will be described. After a predetermined time has elapsed, the elevator 241 lowers the substrate support structure 240. When lowering the substrate support structure 240, the lid 247 is also lowered. Thereby, the lid 247 is separated from the furnace opening 222b. A lowering method of lowering the substrate support structure 240 will be described later in detail. When the substrate support structure 240 is lowered, the substrate S is transferred (or unloaded) out of the substrate support structure 240 in the order reverse to that of loading the substrate S in the substrate loading step S204. When unloading the substrate S, it is preferable to open the gate valve 149 with a movement of the substrate support structure 240 stopped. Thereby, it is possible to suppress a formation of a turbulent flow in the inner atmosphere of the transfer chamber 270, which is generated by moving the substrate support structure 240. Further, it is preferable to set a pressure relationship in each chamber such that the inner pressure of the inner reaction tube 222 is higher than the inner pressure of the transfer chamber 270, and the inner pressure of the transfer chamber 270 is lower than the inner pressure of the vacuum transfer chamber 140. By setting the pressure relationship as described above, it is possible to prevent (or suppress) the inner atmosphere of the inner reaction tube 222 from flowing (or moving) into the vacuum transfer chamber 140. As a result, it is possible to suppress a contamination in the vacuum transfer chamber 140. Therefore, it is possible to prevent (or suppress) the gas used in the inner reaction tube 222 from entering the reactor 300, and it is also possible to prevent (or suppress) an unexpected reaction in the reactor 300 (for example, a formation of the film on an inner wall of the vessel).

<Substrate Moving Step S210>

Subsequently, a substrate moving step S210 will be described. The transfer robot 180 on which the substrate S unloaded out of the reactor 200 is placed moves the substrate S such that the substrate S is capable of being transferred (or loaded) into the reactor 300.

<Substrate Loading Step S212>

A substrate loading step S212 will be described. In the substrate loading step S212, the substrate S is transferred (or loaded) into the reactor 300. In the substrate loading step S212, the substrate mounting table 312 is lowered to a position of transferring the substrate S (that is, the transfer position P0) such that the plurality of lift pins 307 penetrate through the plurality of through-holes 314 of the substrate mounting table 312, respectively. As a result, the lift pins 307 protrude from a surface of the substrate mounting table 312 by a predetermined height. In parallel with lowering the substrate mounting table 312 and protruding the lift pins 307 from the surface of the substrate mounting table 312 as described above, by performing a process such as supplying the inert gas through the fourth gas supplier 340 and exhausting an inner atmosphere of the transfer chamber 306, an inner pressure of the transfer chamber 306 is set to be the same as that of the vacuum transfer chamber 140 provided adjacently.

Subsequently, the gate valve 149 is opened so as to communicate the transfer chamber 306 with the vacuum transfer chamber 140 provided adjacently. Then, the transfer robot 180 transfers (or loads) the substrate S from the vacuum transfer chamber 140 into the transfer chamber 306 and places the substrate S on the lift pins 307. After the substrate S is placed on the lift pins 307, the substrate mounting table 312 is elevated until the substrate S is placed on the substrate placing surface 311. Then, the substrate mounting table 312 is further elevated until the substrate S reaches the substrate processing position as shown in FIG. 5. When the substrate S is being placed on the substrate placing surface 311, the electric power is supplied to the heater 313 and the heater 313 is controlled such that a temperature of the surface of the substrate S is adjusted to a predetermined temperature.

<Second Film Processing Step S214>

A second film processing step S214 will be described. In the second film processing step S214, for example, the exhauster 391 and the fourth gas supplier 340 are operated. When a desired inner pressure of the process chamber 301 is reached, by controlling the fourth gas supplier 340, the third gas is supplied to the substrate S in the process chamber 301 so as to process the film on the substrate S. In the second film processing step S214, for example, a process performed on the substrate S refers to a process of modifying the film (which is formed in the first film processing step S206) with the third gas. Further, in the present step, the plasma generator 349 may be operated in accordance with the recipe. According to the present embodiments, by supplying the hydrogen ($H_2$) gas to the SiN film formed in the first film processing step S206, the SiN film is modified.

For example, process conditions of the present step are as follows:

The third gas: $H_2$ gas;

A gas supply amount of the third gas: from 10 sccm to 500 sccm;

The inner pressure of the process chamber 301: from 133 Pa to 6,666 Pa; and

A processing temperature: 100° C. to 600° C.

After a predetermined time has elapsed, a supply of the third gas through the fourth gas supplier 340 is stopped. Further, the inert gas is supplied through the fourth gas supplier 340 to exhaust an inner atmosphere of the process chamber 301.

<Substrate Unloading Step S216>

A substrate unloading step S216 will be described. When a desired process is performed on the substrate S, the substrate S is transferred (unloaded) out of the process chamber 301 in the order reverse to that of loading the substrate S in the substrate loading step S212. When unloading the substrate S, the substrate S is being supported by the transfer robot 180.

<Substrate Moving Step S218>

A substrate moving step S218 will be described. The transfer robot 180 transfers (or unloads) the substrate S out of the reactor 300, and moves the substrate S to the load lock chamber 130. The substrate S is processed by performing the steps described above.

<Details of Lowering Method in Substrate Unloading Step S208>

Subsequently, the lowering method of lowering the substrate support structure 240 in the substrate unloading step S208 will be described in detail. As described above, in the first film processing step S206 before the substrate unloading step S208, the inner pressure of the transfer chamber 270 is controlled to be higher than the inner pressure of the inner reaction tube 222. By performing such a control, the lid 247 is pressed against the furnace opening 222b such that it is possible to suppress a leakage of the inner atmosphere of the inner reaction tube 222. Therefore, it is possible to stably control the inner atmosphere of the inner reaction tube 222.

By the way, in such a situation, the disclosers of the present application have found the following problems. Since the lid 247 is pressed against the furnace opening 222b, the O-ring 248 arranged between the lid 247 and the furnace opening 222b is crushed and deformed. When the O-ring 248 is fixed to the furnace opening 222b, the O-ring 248 adheres to the lid 247 in a deformed state. Furthermore, an adhesion of the O-ring 248 becomes stronger as a temperature thereof becomes higher. Since the O-ring 248 is affected by the heater 211 and the heater 247b, the O-ring 248 may adhere strongly. When the lid 247 is lowered with the O-ring 248 attached to the lid 247, the O-ring 248 may be damaged due to a strong adhesive force. As a result, particles may be generated. One of purposes of the present embodiments is to lower the lid 247 while suppressing the damage to the O-ring 248.

Figure 9:
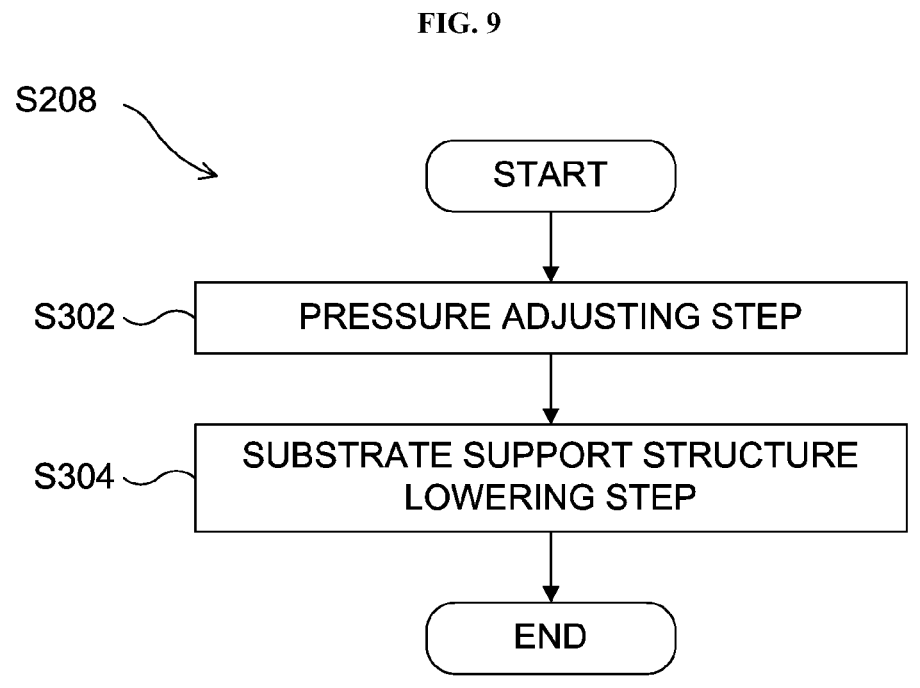

Subsequently, the lowering method in the substrate unloading step S208 will be described in more detail with reference to FIG. 9.

<Pressure Adjusting Step S302>

A pressure adjusting step S302 is a step performed before lowering the substrate support structure 240, that is, before communicating the inside of the inner reaction tube 222 and an inside of the transfer chamber 270. After the substrate S is processed in the inner reaction tube 222 in the first film processing step S206, the supply of the process gases (that is, the first gas and the second gas) into the inner reaction tube 222 is stopped. Thereafter, before communicating the inner reaction tube 222 and the transfer chamber 270, the inner pressure of the inner reaction tube 222 is controlled (or adjusted) to be higher than the inner pressure of the transfer chamber 270. In the pressure adjusting step S302, the inert gas supplier 226, the exhauster 230, the inert gas supplier 271 and the exhauster 280 are controlled such that the inner pressure of the inner reaction tube 222 is adjusted as described above. Further, in the pressure adjusting step S302, the inner pressure of the inner reaction tube 222 may be adjusted by using the pressure detector 234 or the pressure detector 284.

By controlling the inner pressure of the inner reaction tube 222 to be higher than the inner pressure of the transfer chamber 270, it is possible to push out the lid 247 softly by the inner atmosphere of the inner reaction tube 222. In the pressure adjusting step S302, a pressure difference between the inner pressure of the inner reaction tube 222 and the inner pressure of the transfer chamber 270 is set such that the O-ring 248 is not damaged. Specifically, the pressure difference is set to be within a range higher than 0 Pa and less than 3.0 kPa. Therefore, it is possible to restore a shape of the O-ring 248 while suppressing the damage to the O-ring 248 attached to the lid 247. Further, in the pressure adjusting step S302, the O-ring 248 is in a state of sealing the inner atmosphere of the inner reaction tube 222 without being separated from the lid 247.

When adjusting the pressure difference, the inner pressure of the inner reaction tube 222 may be gradually increased to be higher than the inner pressure of the transfer chamber 270. Thereby, no sudden force is applied to the O-ring 248 in the deformed state. As a result, it is possible to restore the shape of the O-ring 248 while surely suppressing the damage to the O-ring 248.

Before or when adjusting the pressure difference, the temperature of the O-ring 248 may be lowered by turning off the heater 211 or reducing the electric power supplied thereto such that a temperature of the heater 211 is set to be a second temperature lower than the first temperature which is the temperature of the heater 211 at which the substrate S is processed. When the temperature of the O-ring 248 is lowered, an adhesion state of the O-ring 248 can be softened. Thereby, it is possible to more easily peel off (or separate) the O-ring 248 from the lid 247. The pressure adjusting step S302 is described by way of an example in which the heater 211 is turned off or the electric power supplied thereto is reduced. However, the pressure adjusting step S302 is not limited thereto. For example, when the heater 247b is provided, the heater 247b may be turned off or the electric power supplied thereto may be reduced so as to lower the temperature of the O-ring 248.

Further, it is preferable that the second temperature is equal to or lower than a heat resistant temperature of the transfer robot 180. As described above, since the inner pressure of the transfer chamber 270 and the inner pressure of the vacuum transfer chamber 140 are set to a vacuum level pressure, a heat leakage efficiency from the substrate S is low. That is, a temperature of the substrate S is not easily lowered. When the temperature of the heater 211 or a temperature of the heater 247b is maintained at a high temperature, it is preferable to wait until the temperature of the substrate S is lowered in the transfer chamber 270, which significantly reduces a transfer throughput. When the substrates S are stacked as in the present embodiments, the temperature of the substrate S is less likely to be lowered due to an influence of the heat between the substrates S. Therefore, by setting the second temperature to be equal to or lower than the heat resistant temperature of the transfer robot 180, it is possible to improve the transfer throughput. Further, it is preferable that the second temperature is set to be a temperature at which a temperature sensor 250 provided on the shaft 243 is not adversely affected. Further, the temperature sensor 250 may be provided on the elevator 241.

Further, for example, the second temperature is set to be a temperature within a range from a room temperature (about 25° C.) to 100° C. By setting the second temperature within such a range, it is possible to easily peel off (or separate) the O-ring 248 from the lid 247. Further, when the second temperature is equal to or lower than the heat resistant temperature of the transfer robot 180, it is possible to increase a transfer efficiency (that is, the transfer throughput). Further, when the second temperature is set such that the temperature sensor 250 is not adversely affected, it is possible to avoid a failure of the temperature sensor 250 or a decrease in a processing throughput due to the failure.

After a predetermined time has elapsed with the inner pressure of the inner reaction tube 222 set to be higher than the inner pressure of the transfer chamber 270, a substrate support structure lowering step S304 is performed. For example, the "predetermined time" in the pressure adjusting step S302 refers to a time (time duration) until a deformed shape of the O-ring 248 in the deformed state is restored. Further, in the pressure adjusting step S302, the inner pressure of the inner reaction tube 222 and the inner pressure of the transfer chamber 270 are measured, and the substrate support structure lowering step S304 may be performed when the measured results reach predetermined values, respectively.

<Substrate Support Structure Lowering Step S304>

After the predetermined time has elapsed with the inner pressure of the inner reaction tube 222 set to be higher than the inner pressure of the transfer chamber 270 in the pressure adjusting step S302, in the substrate support structure lowering step S304, the elevator 241 lowers the substrate support structure 240 while maintaining a pressure control of setting the inner pressure of the inner reaction tube 222 to be higher than the inner pressure of the transfer chamber 270. As described above, for example, the "predetermined time" in the pressure adjusting step S302 refers to the time until the deformed shape of the O-ring 248 in the deformed state is restored. Therefore, in the substrate support structure lowering step S304, it is possible to easily peel off (or separate) the O-ring 248 from the lid 247 while suppressing the damage to the O-ring 248. As a result, by lowering the substrate support structure 240 after the predetermined time has elapsed, it is possible to lower the substrate support structure 240 while suppressing a generation of the particles due to the damage of the O-ring 248.

In the substrate support structure lowering step S304, a control of the inert gas supplier 226, a control of the exhauster 230 and a control of the exhauster 280 may be performed such that a pressure relationship described above in the pressure adjusting step S302 can be maintained. In such a case, the inner atmosphere of the inner reaction tube 222 and the inner atmosphere of the transfer chamber 270 are adjusted such that the inner pressure of the inner reaction tube 222 and the inner pressure of the transfer chamber 270 gradually become the same pressure. Thereby, the pressure does not change suddenly. Therefore, it is possible to prevent the turbulent flow of the atmosphere (such as the inner atmosphere of the transfer chamber 270), which is generated by a sudden pressure change. As a result, it is possible to prevent (or suppress) the particles from adhering to the substrate S in the substrate support structure 240 or to prevent (or suppress) the particles from entering into inner reaction tube 222, which is generated by a lifting up of the particles due to the turbulent flow. Further, when the pressure relationship described above in the pressure adjusting step S302 is maintained, it is possible to control the inner atmosphere of the transfer chamber 270 to flow to the exhaust pipe 281. Therefore, it is possible to prevent the inner atmosphere of the transfer chamber 270 from flowing back into the inner reaction tube 222 or flowing into the vacuum transfer chamber 140.

Further, in the substrate support structure lowering step S304, the inner pressure of the transfer chamber 270 may be controlled to be further reduced. That is, the inner pressure of the inner reaction tube 222 may be controlled to be further higher than the inner pressure of the transfer chamber 270. In such a case, for example, while maintaining the control of the inert gas supplier 226, a control of the inert gas supplier 271 and the control of the exhauster 230, an opening degree of the valve 282 is controlled so to increase an exhaust amount of the exhauster 280. By maintaining the control of the inert gas supplier 226, the control of the inert gas supplier 271 and the control of the exhauster 230, it is possible to suppress a sudden change in the inner atmosphere of the inner reaction tube 222.

Further, by setting the inner pressure of the inner reaction tube 222 to be higher than the inner pressure of the transfer chamber 270, it is possible to form (or generate) a gas flow from the inside of the inner reaction tube 222 to the inside of the transfer chamber 270. Thereby, it is possible to prevent (or suppress) the inner atmosphere of the transfer chamber 270 from entering the inner reaction tube 222. As a result, the inner atmosphere of the inner reaction tube 222 and the inner atmosphere of the transfer chamber 270 can be maintained clean. Further, since the control of the exhauster 280 is changed while maintaining the control of the exhauster 230, it is possible to exhaust the inner atmosphere of the inner reaction tube 222 without generating the turbulent flow in the inner reaction tube 222 or in the transfer chamber 270. Therefore, it is possible to prevent (or suppress) the particles from being diffused in the inner reaction tube 222. Further, by gradually reducing the opening degree of the valve 282, it is possible to exhaust the inner atmosphere of the inner reaction tube 222 without generating the turbulent flow in the transfer chamber 270. It is possible to prevent the turbulent flow of the inner atmosphere of the inner reaction tube 222 (which is generated by the sudden pressure change), and as a result, it is possible to prevent (or suppress) the particles from adhering to the substrate S in the substrate support structure 240 or to prevent (or suppress) the particles from entering into inner reaction tube 222, which is generated by the lifting up of the particles due to the turbulent flow.

Further, the substrate support structure lowering step S304 is described by way of an example in which the inner pressure of the inner reaction tube 222 is set to be higher than the inner pressure of the transfer chamber 270 in the pressure adjusting step S302 and the elevator 241 lowers the substrate support structure 240 after the predetermined time has elapsed. However, the present embodiments are not limited thereto. For example, the shaft 243 may be lowered based on results detected by the pressure detector 234 and the pressure detector 284. For example, when a pressure difference between the pressure detector 234 and the pressure detector 284 reaches a predetermined pressure difference, the shaft 243 is lowered. The "predetermined pressure difference" described above may refer to a pressure difference by which the O-ring 248 is not damaged. For example, the predetermined pressure difference is set to be within a range higher than 0 kPa and less than 3.0 kPa.

<Other Embodiments>

While the technique of the present disclosure is described in detail by way of the embodiments described above, the technique of the present disclosure is not limited thereto. The technique of the present disclosure may be modified in various ways without departing from the scope thereof. For example, the embodiments described above are described by way of an example in which the substrate processing apparatus 100 is provided with the reactor 200 and the reactor 300 (that is, four reactors 200a, 200b, 200c and 300). However, the technique of the present disclosure is not limited thereto. For example, the technique of the present disclosure may be applied when a substrate processing apparatus is provided with five or more reactors, more specifically, eight or more reactors including the reactor 200 and the reactor 300.

For example, the embodiments described above are described by way of an example in which, in the film-forming process performed by the substrate processing apparatus 100, the SiN film is formed on the substrate S by using the HCDS gas as the first element-containing gas (that is, the first gas) and the $NH_3$ gas as the second element-containing gas (that is, the second gas). However, the technique of the present disclosure is not limited thereto. That is, the process gases used in the film-forming process are not limited to the HCDS gas and the $NH_3$ gas, and other gases may be used to form different films. Further, the technique of the present disclosure may also be applied to film-forming processes using three or more different process gases. Further, for example, instead of silicon (Si), an element such as titanium (Ti), zirconium (Zr) and hafnium (Hf) may be used as the first element. In addition, for example, instead of nitrogen (N), an element such as oxygen (O) may be used as the second element.

For example, the embodiments described above are described by way of an example in which the hydrogen-containing gas (that is, the third gas) is used to perform a modification process. However, the technique of the present disclosure is not limited thereto. For example, a gas containing one of oxygen (O), nitrogen (N), carbon (C) and hydrogen (H) or a combination thereof may be used as the third gas to perform the modification process.

For example, the embodiments described above are described by way of an example in which the modification process is performed after the film-forming process. However, the technique of the present disclosure is not limited thereto. For example, the film-forming process may be performed after the modification process.

For example, the embodiments described above are described by way of an example in which the film-forming process and the modification process are performed by the substrate processing apparatus 100. However, the technique of the present disclosure is not limited thereto. That is, the technique of the present disclosure can be applied not only to the film-forming process and the modification process exemplified in the embodiments described above but also to another film-forming process or another modification process of another film. Further, specific contents of the substrate processing are not limited. For example, in addition to or instead of the film-forming process and the modification process exemplified in the embodiments described above, a process such as an annealing process, a diffusion process, an oxidation process, a nitridation process and a lithography process may be performed as the substrate processing. Further, the technique of the present disclosure may also be applied to other substrate processing apparatuses such as an annealing apparatus, an etching apparatus, an oxidation apparatus, a nitridation apparatus, an exposure apparatus, a coating apparatus, a drying apparatus, a heating apparatus, an apparatus using the plasma and combinations thereof. The technique of the present disclosure may also be applied when a constituent of an embodiment of the technique of the present disclosure is substituted with another constituent of another embodiment of the technique of the present disclosure, or when a constituent of the embodiment is added to another embodiment. Further, the technique of the present disclosure may also be applied when the constituent of the embodiment is omitted or substituted, or when a constituent is added to the embodiment.

According to some embodiments of the present disclosure, it is possible to suppress interference between processes respectively performed in the plurality of reactors when the plurality of reactors are configured to be capable of performing different processes, respectively.

23

24

What is claimed is:

1. A substrate processing apparatus comprising:

a first vessel comprising:

a loading/unloading port structure constituting a loading/unloading port through which a substrate is capable of being transferred; and a process chamber in which the substrate is accommodated;

a second vessel provided adjacent to the first vessel and configured to be capable of communicating with the first vessel via the loading/unloading port;

a lid configured to be capable of closing the loading/unloading port;

a seal arranged between the loading/unloading port structure and the lid; and a controller configured to be capable of controlling an inner pressure of the first vessel and an inner pressure of the second vessel such that the inner pressure of the first vessel is set to be lower than the inner pressure of the second vessel with the loading/unloading port closed by the lid while the substrate is processed in the process chamber and such that the inner pressure of the first vessel is set to be gradually higher than the inner pressure of the second vessel after the substrate is processed and before the first vessel comes into communication with the second vessel to restore a shape of the seal while suppressing damage to the seal.

2. The substrate processing apparatus of claim 1, further comprising:

a third vessel in which a process different from that of the first vessel is capable of being performed;

a vacuum transfer chamber provided between the second vessel and the third vessel and in which the substrate is capable of being transferred; and a gate valve provided between the second vessel and the vacuum transfer chamber, wherein the second vessel comprises:

a substrate support configured to support the substrate;

a shaft configured to support the substrate support; and an elevator capable of elevating and lowering the substrate support, and wherein the controller is further configured to be capable of opening the gate valve after a movement of the shaft is stopped.

3. The substrate processing apparatus of claim 1, further comprising a heater capable of heating the process chamber, wherein a temperature of the heater is controlled to maintain a first temperature at which the seal is deformed while the substrate is processed in the process chamber, and wherein the temperature of the heater is controlled to maintain a second temperature lower than the first temperature after the substrate is processed and before the first vessel comes into communication with the second vessel.

4. The substrate processing apparatus of claim 3, wherein the heater comprises a wall heater spaced apart from and arranged along a wall of the process chamber extending in a vertical direction, and wherein the seal is provided below the wall.

5. The substrate processing apparatus of claim 3, wherein the heater comprises a lid heater provided at the lid.

6. The substrate processing apparatus of claim 3, wherein the second vessel comprises:

a substrate support configured to support the substrate;

a shaft configured to support the substrate support;

an elevator capable of elevating and lowering the substrate support, and wherein a sensor is provided at the shaft or the elevator, and wherein the second temperature is set to be a temperature at which the sensor is not adversely affected.

7. The substrate processing apparatus of claim 3, wherein the second temperature is within a range equal to or greater than a room temperature and equal to or less than 100° C.

8. The substrate processing apparatus of claim 1, further comprising:

a substrate support configured to support the substrate;

a shaft configured to support the substrate support;

an elevator capable of elevating and lowering the substrate support; and an exhaust pipe provided at the second vessel, wherein, in parallel with lowering the shaft, an inner atmosphere of the second vessel is controlled so as not to flow into the first vessel.

9. The substrate processing apparatus of claim 1, further comprising:

a substrate support configured to support the substrate;

a shaft configured to support the substrate support;

an elevator capable of elevating and lowering the substrate support; and an exhaust pipe provided at the second vessel, wherein, in parallel with lowering the shaft, an inner atmosphere of the second vessel is controlled so as to flow into the exhaust pipe.

10. The substrate processing apparatus of claim 9, wherein a valve is provided at the exhaust pipe, and wherein the valve is controlled to be operated in parallel with lowering the shaft.

11. The substrate processing apparatus of claim 10, wherein an opening degree of the valve is gradually reduced in parallel with lowering the shaft.

12. The substrate processing apparatus of claim 1, further comprising:

a substrate support configured to support the substrate;

a shaft configured to support the substrate support; and an elevator capable of elevating and lowering the substrate support, wherein the inner pressure of the first vessel is controlled to be higher than the inner pressure of the second vessel after the substrate is processed and before the first vessel comes into communication with the second vessel, and the shaft starts being lowered when a pressure difference between the first vessel and the second vessel reaches a predetermined value.

13. The substrate processing apparatus of claim 12, wherein the predetermined value is set to be a value at which the seal is not damaged.

14. The substrate processing apparatus of claim 12, wherein the predetermined value is higher than 0 kPa and less than 3.0 kPa.

15. The substrate processing apparatus of claim 1, further comprising:

a substrate support configured to support the substrate;

a shaft configured to support the substrate support; and an elevator capable of elevating and lowering the substrate support, wherein a control is performed such that the inner pressure of the first vessel is set to be higher than the inner pressure of the second vessel after the substrate is processed and before the first vessel comes into communication with the second vessel, and after a predetermined time has elapsed, the shaft is controlled to be lowered while maintaining the control.

16. The substrate processing apparatus of claim 1, further comprising:

a substrate support configured to support the substrate;

a shaft configured to support the substrate support;

an elevator capable of elevating and lowering the substrate support;

a first atmosphere controller configured to be capable of controlling an inner atmosphere of the first vessel; and a second atmosphere controller configured to be capable of controlling an inner atmosphere of the second vessel, wherein a control of the first atmosphere controller and a control of the second atmosphere controller are performed such that the inner pressure of the first vessel is higher than the inner pressure of the second vessel after the substrate is processed and before the first vessel comes into communication with the second vessel, and thereafter the control of the first atmosphere controller is maintained and the control of the second atmosphere controller is changed while the shaft is being lowered.

17. A method of manufacturing a semiconductor device using a substrate processing apparatus comprising: a first vessel comprising a loading/unloading port structure constituting a loading/unloading port through which a substrate is capable of being transferred and a process chamber in which the substrate is accommodated; a second vessel provided adjacent to the first vessel and configured to be capable of communicating with the first vessel via the loading/unloading port; a lid configured to be capable of closing the loading/unloading port; and a seal arranged between the loading/unloading port structure and the lid, the method comprising:

(a) setting an inner pressure of the first vessel to be lower than an inner pressure of the second vessel with the loading/unloading port closed by the lid while the substrate is processed in the process chamber; and (b) setting the inner pressure of the first vessel to be gradually higher than the inner pressure of the second vessel after the substrate is processed and before the first vessel comes into communication with the second vessel to restore a shape of the seal while suppressing damage to the seal.

18. A non-transitory computer-readable recording medium storing a program related to a substrate processing apparatus comprising: a first vessel comprising a loading/unloading port structure constituting a loading/unloading port through which a substrate is capable of being transferred and a process chamber in which the substrate is accommodated; a second vessel provided adjacent to the first vessel and configured to be capable of communicating with the first vessel via the loading/unloading port; a lid configured to be capable of closing the loading/unloading port; and a seal arranged between the loading/unloading port structure and the lid, wherein the program causes, by a computer, the substrate processing apparatus to perform:

(a) setting an inner pressure of the first vessel to be lower than an inner pressure of the second vessel with the loading/unloading port closed by the lid while the substrate is processed in the process chamber; and (b) setting the inner pressure of the first vessel to be gradually higher than the inner pressure of the second vessel after the substrate is processed and before the first vessel comes into communication with the second vessel to restore a shape of the seal while suppressing damage to the seal.

19. The substrate processing apparatus of claim 1, wherein the controller is further configured to be capable of controlling the inner pressure of the first vessel and the inner pressure of the second vessel to be constantly maintained in a state where the seal remains deformed while the substrate is processed in the process chamber.

20. The substrate processing apparatus of claim 1, wherein the first vessel further comprises a first exhaust structure capable of exhausting an inner atmosphere of the first vessel, and the second vessel further comprises a second exhaust structure controllable independently from the first exhaust structure and capable of exhausting an inner atmosphere of the second vessel.

\* \* \* \* \*